US008736336B2

(12) United States Patent
Kishimoto

(10) Patent No.: US 8,736,336 B2
(45) Date of Patent: May 27, 2014

(54) PHASE SHIFTER HAVING TRANSISTOR OF WHICH IMPEDANCE IS CHANGEABLE ACCORDING TO PHASE CONTROL AMOUNT

(75) Inventor: Shuya Kishimoto, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 13/641,643

(22) PCT Filed: Jan. 20, 2011

(86) PCT No.: PCT/JP2011/000272
§ 371 (c)(1),
(2), (4) Date: Oct. 16, 2012

(87) PCT Pub. No.: WO2011/132348
PCT Pub. Date: Oct. 27, 2011

(65) Prior Publication Data
US 2013/0033296 A1    Feb. 7, 2013

(30) Foreign Application Priority Data

Apr. 19, 2010    (JP) ................................ 2010-096013

(51) Int. Cl.
*H03K 3/00*    (2006.01)
*H03H 11/16*   (2006.01)
*H03K 5/13*    (2006.01)

(52) U.S. Cl.
USPC ......... 327/254; 327/255; 455/127.1; 455/129

(58) Field of Classification Search
USPC ................................. 327/254, 255
See application file for complete search history.

(56) References Cited

U.S. PATENT DOCUMENTS

| 2006/0232359 A1 | 10/2006 | Fukuda et al. |
| 2008/0074163 A1 | 3/2008 | Itagaki |
| 2010/0315170 A1* | 12/2010 | Locascio et al. ................. 331/15 |
| 2010/0323645 A1 | 12/2010 | Kishimoto |

FOREIGN PATENT DOCUMENTS

| JP | S6070802 A | 4/1985 |
| JP | H03291008 A | 12/1991 |
| JP | H0730463 A | 1/1995 |
| JP | 2001168668 A | 6/2001 |
| JP | 2005142724 A | 6/2005 |

(Continued)

OTHER PUBLICATIONS

The international search report for PCT/JP2011/000272 mailed on Mar. 15, 2011.

*Primary Examiner* — John Poos
(74) *Attorney, Agent, or Firm* — Sughrue Mion, PLLC

(57) ABSTRACT

A 0-to-90-degree phase shifter (13) includes a voltage-variable power supply (16), a transistor (17), a 90-degree divider (18), gain-variable amplifiers (19) (19-1 and 19-2), and a combiner (20). The 90-degree divider (18) divides an input signal into a signal to which a 90-degree phase is given and a signal to which no phase is given, and outputs the divided signals to the gain-variable amplifiers (19). The gain-variable amplifiers (19) (19-1 and 19-2) output signals whose amplitudes are changed according to a phase control amount to the combiner (20). The combiner (20) combines the signals input from the two gain-variable amplifiers (19) and outputs the combined signal. The impedance between the source and the drain of the transistor connected to the isolation port of the 90-degree divider (18) can be changed as appropriate.

9 Claims, 14 Drawing Sheets

(56) References Cited

FOREIGN PATENT DOCUMENTS

| JP | 2006295562 A | 10/2006 |
| JP | 200828681 A | 2/2008 |
| WO | 2009101993 A1 | 8/2009 |

* cited by examiner

| PHASE CONTROL AMOUNT | TRANSISTOR 17-1 | TRANSISTOR 17-2 | GAIN-VARIABLE AMPLIFIER 19-1 | GAIN-VARIABLE AMPLIFIER 19-2 | GAIN-VARIABLE AMPLIFIER 19-3 | GAIN-VARIABLE AMPLIFIER 19-4 |
|---|---|---|---|---|---|---|
| 0° | MAXIMUM | | OFF | ON | OFF | OFF |
| 90° | MINIMUM | | ON | OFF | OFF | OFF |
| 180° | | MAXIMUM | OFF | OFF | ON | OFF |
| 270° | | MINIMUM | OFF | OFF | OFF | ON |

Fig. 4

PHASE SHIFTER HAVING TRANSISTOR OF WHICH IMPEDANCE IS CHANGEABLE ACCORDING TO PHASE CONTROL AMOUNT

TECHNICAL FIELD

The present invention relates to a phase shifter.

BACKGROUND ART

As the amount of communication information has increased in recent years, radio communication techniques using high-frequency bands, capable of transmitting a large amount of information at high speed are attracting a lot of attention. In particular, in 60 GHz bands, any user can use up to 2.5 GHz band per radio device without possessing any license. Therefore, it is possible to perform communication at a rate equal to or higher than 1 Gbps by using such radio devices.

In general, sine the propagation loss in a free space becomes larger in high-frequency bands, antennas having a high gain are used in order to increase the communication distance. When an antenna having a high gain is used, it is very difficult to perform the alignment of the antenna because the half-width of the radiation pattern is narrow. In communication using an antenna having a high gain, it is possible to perform excellent communication by performing the communication while changing the radiation angle of radio signals, finding a radiation angle at which the received power is maximized, and using that radiation angle. When the antenna is deviated from the proper alignment, the above-described process is performed again so that the optimal communication state can be automatically maintained.

FIG. 15 shows a radio communication apparatus that automatically performs the alignment of an antenna. A radio communication apparatus 63 transmits a radio signal while changing the direction of the radiation angle. Meanwhile, a radio communication apparatus 64 measures the S/N (signal-noise) ratio of a received radio signal and transmits the measured value to the radio communication apparatus 63. The radio communication apparatus 63 calculates the radiation angle at which the S/N ratio is maximized based on the notified measured value, and then performs communication by using that radiation angle.

As a method for controlling the radiation angle of a radio communication apparatus, there is a control method using an antenna array. The antenna array is an antenna formed by arranging a plurality of antenna elements in an array. In the control using an antenna array, the radiation angle is controlled by controlling the phases of radio signals emitted from individual antenna elements. Note that a phase shifter is used for the phase control of a radio signal.

FIG. 16 is a block diagram showing a typical configuration of a phase shifter. This phase shifter includes a 180-degree divider 65, 0-to-90-degree phase shifters 66 (66-1 and 66-2), and a combiner 67. The 0-to-90-degree phase shifters include 90-degree dividers 69 (69-1 and 69-2), gain-variable amplifiers 70 (70-1 to 70-4), combiners 71, and resistors 68 (68-1 and 68-2).

Each of the 90-degree dividers 69 is composed of a 4-terminal circuit. The isolation ports of the 90-degree dividers 69 are connected to the ground through the resistors 68. Each of the resistors 68 preferably has a resistance value equal to the characteristic impedance of the transmission line. Typically, a 50Ω-resistor is connected.

A signal input to the phase shifter shown in FIG. 16 is divided into four radio signals having phases of 0, 90. 180 and 270 degrees by the 180-degree divider 65 and the two 90-degree dividers 69, and these four signals are input to the gain-variable amplifiers 70 (70-1 to 70-4). The gain-variable amplifiers 70-1 to 70-4 change the amplitudes of the input signals. Each of the combiners 71 (71-1 and 71-2) combines two signals input from the respective gain-variable amplifiers 70 and outputs the combined signal to the combiner 67. Similarly, the combiner 67 combines signals input from the combiners 71-1 and 71-2.

Note that the amplitude change rates by the gain-variable amplifiers 70-1 to 70-4 are changed according to the desired phase angle. For example, when a phase of or close to 90 degrees with respect to an input signal is to be set, one of the gain-variable amplifiers 70 to which a signal having a phase of 90 degrees is input amplifies this signal and the other gain-variable amplifiers 70 decrease the amplitudes of their input signals. With the operation like this, the phase control amount of the phase shifter shown in FIG. 16 can be set to an arbitrary angle within the range from 0 degrees to 360 degrees.

However, depending on the use conditions of the radio device, the number of antenna arrays, and/or the like, the phase control amount of the phase shifter does not necessarily have to be set to an arbitrary angle. For example, Patent literature 1 proposes a phase shifter that is used for the cases where the phase is controlled in steps of 90 degrees. However, when this phase shifter is used, the same number of quadrature modulators as the number of antennas are necessary. Therefore, although depending on the phase shifter, it is very difficult to perform an IQ mismatch correction for individual quadrature modulators. As a result, the process becomes easier when the phase is controlled in a radio signal band than when the phase is controlled in a baseband signal band by using the phase shifter disclosed in Patent literature 1.

CITATION LIST

Patent Literature

Patent literature 1: International Patent Publication No. WO2009/101993

SUMMARY OF INVENTION

Technical Problem

However, the following problem occurs when the phase is controlled in a radio signal band by using the phase shifter shown in FIG. 16. In the above-described 0-to-90-degree phase shifters 66, the 90-degree dividers 69 are connected to the resistors 68 through the isolation ports. Therefore, when the 0-to-90-degree phase shifters 66 perform phase control of 0 degrees or 90 degrees, i.e., even when the 90-degree divider 69 supplies an output signal from only one of the output ports, the phase shifter is affected by the resistor. As a result, part of the input electric power is unnecessarily consumed, and thereby causing a power loss.

The present invention has been made to solve the problem like this, and a main object thereof is to provide a phase shifter that causes little loss when phase control is performed in steps of 90 degrees.

Solution to Problem

An aspect of a phase shifter according to the present invention is a phase shifter that gives a phase to an input signal in a range from 0 degrees to 90 degrees, including:

a 90-degree divider that divides an input signal into a signal to which a 90-degree phase is given and a signal to which no phase is given, and outputs the divided signals;

a first gain-variable amplifier that outputs a signal whose amplitude is changed according to a phase control amount of the phase shifter, the first gain-variable amplifier being connected to a 0-degree side output port of the 90-degree divider;

a second gain-variable amplifier that outputs a signal whose amplitude is changed according to the phase control amount, the second gain-variable amplifier being connected to a 90-degree side output port of the 90-degree divider; and a combiner that combines an output signal of the first gain-variable amplifier and an output signal of the second gain-variable amplifier, in which an impedance of an isolation port of the 90-degree divider is variable.

Advantageous Effects of Invention

According to the present invention, it is possible to provide a phase shifter that causes little loss when phase control is performed in steps of 90 degrees.

BRIEF DESCRIPTION OF DRAWINGS

FIG. 4 is a table showing relations between phase control amounts, transistors, and amplitude rates of gain-variable amplifiers according to a first exemplary embodiment;

DESCRIPTION OF EMBODIMENTS

<First Exemplary Embodiment>

Figure 1:
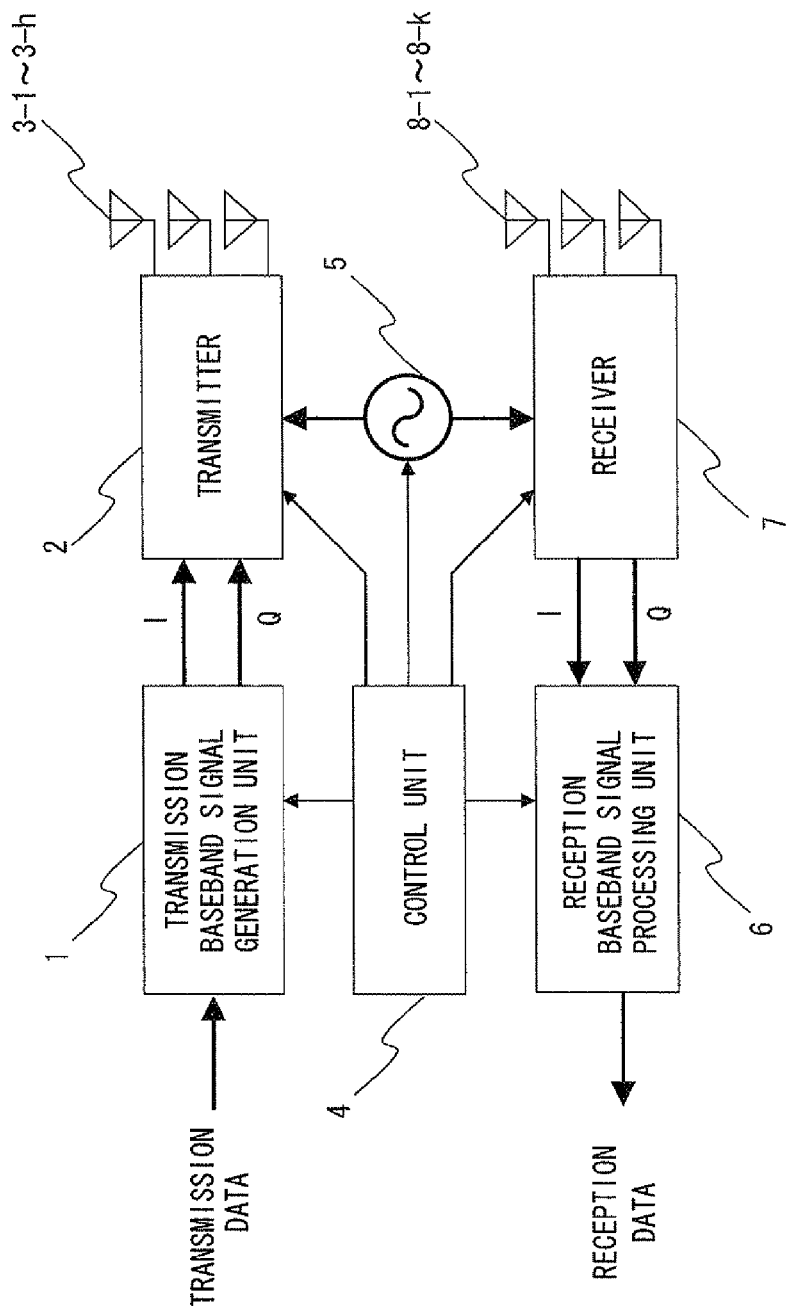
FIG. 1 is a block diagram showing a configuration of a radio communication apparatus according to an exemplary embodiment of the present invention.

Exemplary embodiments of the present invention are explained hereinafter with reference to the drawings. FIG. 1 is a block diagram showing a configuration of a radio communication apparatus including a phase shifter according to a first exemplary embodiment of the present invention. The radio communication apparatus includes a transmission baseband signal generation unit 1, a transmitter 2, transmission antennas 3-1 to 3-h (h is a natural number), a control unit 4, a local signal oscillator circuit 5, a reception baseband signal processing unit 6, a receiver 7, and reception antennas 8-1 to 8-k (k is a natural number).

The transmission baseband signal generation unit 1 generates an I (In-phase) signal and a Q (Quadrature-phase) signal, which are baseband signals, from input transmission data based on a control signal input from the control unit 4, and outputs the generated signals to the transmitter 2.

The transmitter 2 up-converts the input two baseband signals, i.e., the I signal and the Q signal to a transmission frequency based on a local signal supplied from the local signal oscillator circuit 5. In the up-conversion process, the transmitter 2 controls the phase of the transmission signal based on a control signal supplied from the control unit 4. After that, the transmitter 2 transmits the transmission signal, whose phase has been controlled, through a plurality of transmission antennas 3-1 to 3-h.

Figure 2:
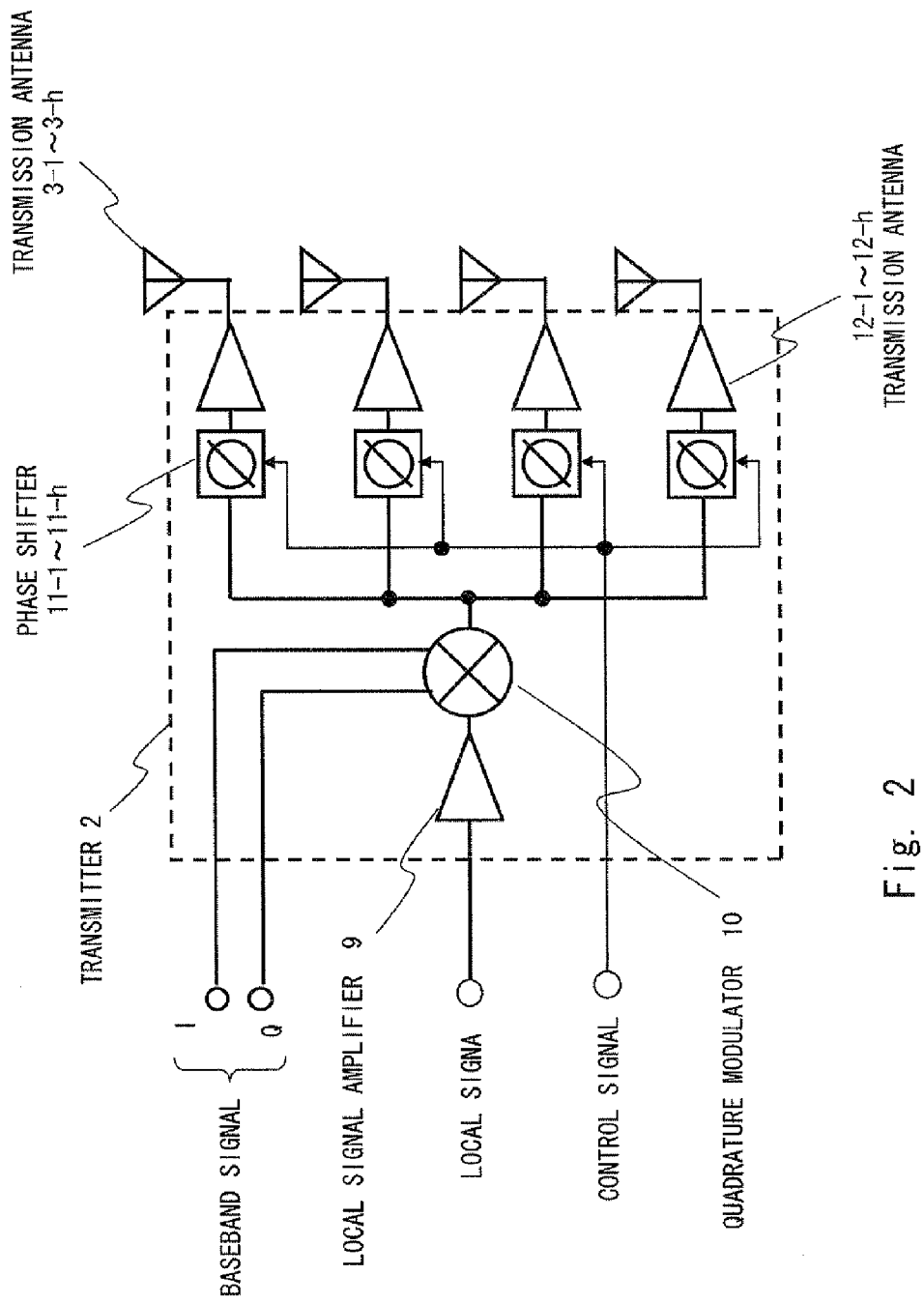
FIG. 2 is a block diagram showing a configuration of a transmitter according to an exemplary embodiment of the present invention.

The configuration of the transmitter 2 is explained in detail with reference to FIG. 2. The transmitter 2 includes a local signal amplifier 9, a quadrature modulator 10, phase shifters 11-1 to 11-h (h is a natural number), and transmission amplifiers 12-1 to 12-h.

A local signal is input from the local signal oscillator circuit 5 to the local signal amplifier 9. The local signal amplifier 9 amplifies the input local signal until the local signal has an appropriate electric power. The local signal amplifier 9 outputs the amplified signal to the quadrature modulator 10.

The I signal and the Q signal, which are baseband signals, are input to the quadrature modulator 10. Further, the amplified local signal is input from the local signal amplifier 9 to the quadrature modulator 10. The quadrature modulator 10 performs a frequency conversion based on the local signal so that the I signal and the Q signal become signals in a radio frequency band. The quadrature modulator 10 divides the frequency-converted signals according to the number (h) of transmission antennas and supplies the divided signals to the transmission antennas. The signals input to the transmission antennas 3-1 to 3-h are transmitted to an intended transmission object(s).

Next, the receiving function of the radio communication apparatus is explained with reference to FIG. 1. The receiver 7 down-converts a reception signal received through the reception antennas 8-1 to 8-k (k is a natural number) based on a local signal input from the local signal oscillator circuit 5 until the frequency of the reception signal becomes equal to that of the baseband signal. In the down-conversion process, the receiver 7 controls the phase of the reception signal based on a control signal supplied from the control unit 4. After that, the receiver 7 outputs an I signal and an Q signal, which are generated baseband signals, to the reception baseband signal processing unit 6.

The reception baseband signal processing unit 6 generates reception data from the I signal and the Q signal, which are baseband signals, based on a control signal input from the control unit 4, and outputs the generated reception data. Further, the reception baseband signal processing unit 6 outputs calculated reception data to the control unit 4. The control unit 4 calculates the optimal phase amount of the transmitter 2 and the receiver 7 based on the input reception data. The control unit 4 outputs the calculated optimal phase amount to the transmitter 2 and the receiver 7.

Note that although the above explanation is made on the assumption that the radio communication apparatus includes both the transmission antennas 3-1 to 3-h and the reception antennas 8-1 to 8-k, the present invention is not limited to this configuration. For example, the radio communication apparatus may include common antennas that serve as both the transmission antennas and the reception antennas, and selectively connect the transmitter 2 or the receiver 7 to those antennas.

Further, although the above explanation is made by using an example in which the radio communication apparatus uses I signal and Q signal, the present invention is not limited to this configuration. For example, the radio communication apparatus may use signals in an arbitrary intermediate frequency band.

Figure 3:
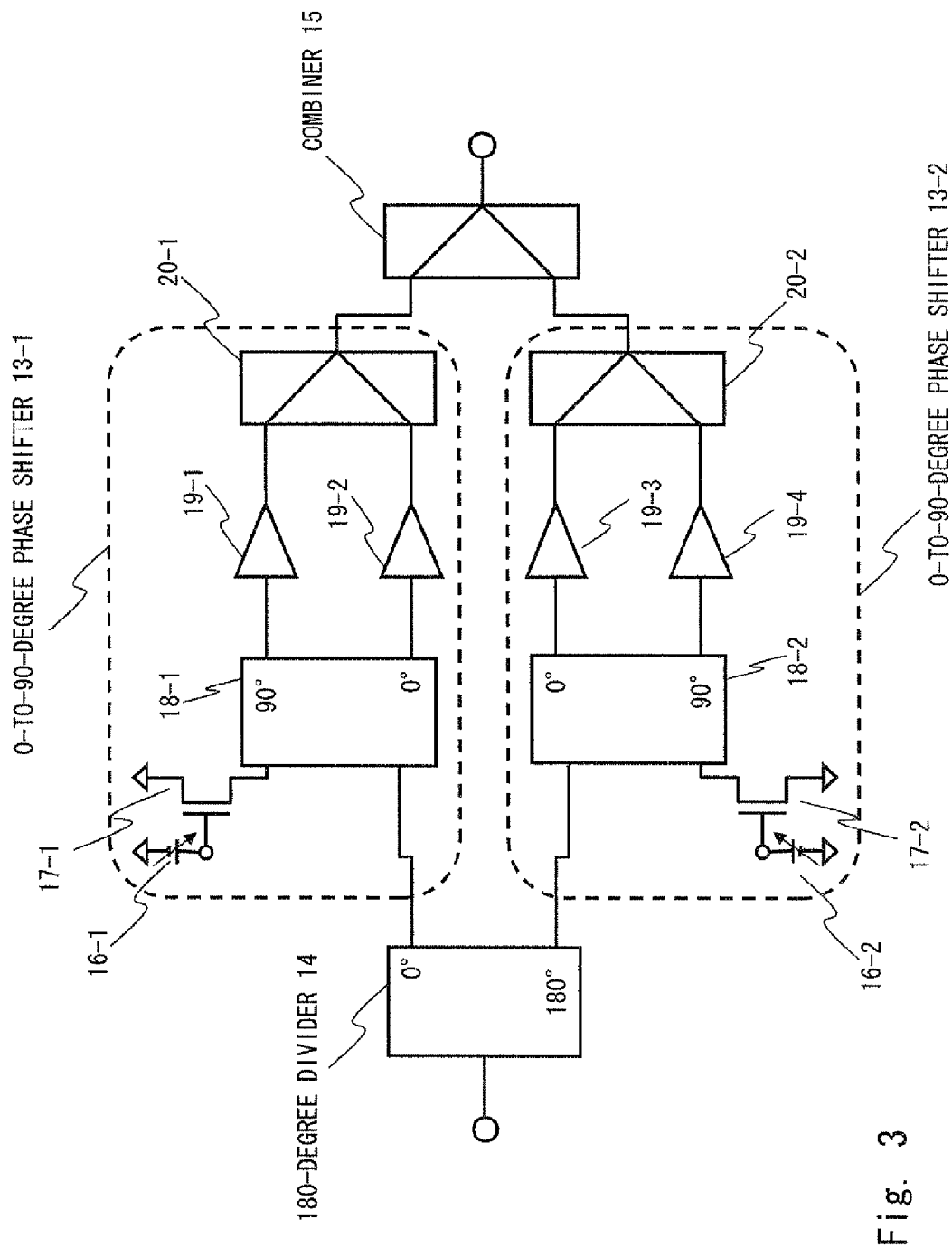
FIG. 3 is a block diagram showing a configuration of a phase shifter according to a first exemplary embodiment.

Next, phase shifters (11-1 to 11-h) according to this exemplary embodiment are explained. FIG. 3 is a block diagram showing a configuration of a phase shifter according to this exemplary embodiment. This phase shifter includes 0-to-90-degree phase shifters 13 (13-1 and 13-2), a 180-degree divider 14, and a combiner 15.

The 0-to-90-degree phase shifters 13 include voltage-variable power supplies 16 (16-1 and 16-2), transistors 17 (17-1 and 17-2), 90-degree dividers 18 (18-1 and 18-2), gain-variable amplifiers 19, and combiners 20. The isolation ports of the 90-degree dividers 18 are connected to the ground through the transistors 17. Each of the 90-degree dividers 18 is composed of, for example, a 4-terminal circuit such as a directional coupler and a branch line circuit.

The 180-degree divider 14 divides an input signal into two signals having a 180-degree phase difference. The 180-degree divider 14 supplies the divided signals to the 90-degree dividers 18-1 and 18-2. The 90-degree divider 18-1 divides an input signal into two signals having a 90-degree phase difference. The 90-degree divider 18-1 supplies the divided signals to the gain-variable amplifiers 19-1 and 19-2 respectively. Similarly, the 90-degree divider 18-2 divides an input signal into two signals having a 90-degree phase difference. The 90-degree divider 18-2 supplies the divided signals to the gain-variable amplifiers 19-3 and 19-4 respectively.

Each of the gain-variable amplifiers 19-1 to 19-4 changes the amplitude of an input signal. Note that the amplitude change rates by the gain-variable amplifiers 19-1 to 19-4 are changed according to the desired phase angle. The gain-variable amplifiers 19-1 and 19-2 supply the signals, whose amplitude has been changed, to the combiner 20-1. The gain-variable amplifiers 19-3 and 19-4 supply the signals, whose amplitude has been changed, to the combiner 20-2.

The combiner 20-1 combines the input two signals. The combiner 20-1 outputs the combined signal to the combiner 15. Similarly, the combiner 20-2 combines the input two signals. The combiner 20-2 outputs the combined signal to the combiner 15. The combiner 15 combines the input two signals. The combiner 15 outputs the combined signal as a signal having a desired phase.

Next, operations of the 0-to-90-degree phase shifters 13 for cases where the phase control amount of the 0-to-90-degree phase shifters 13 is 0 degrees, 90 degrees, and 0 to 90 degrees (except for 0 and 90 degrees) are explained. When the phase control amount is 0 degrees, the output voltages of the voltage-variable power supplies 16 are set by a control signal supplied from a control unit (not shown) so that the impedance between the source and the drain of the transistor 17 is maximized. Further, the amplification factor of the gain-variable amplifier 19-2 is set to the highest level.

When the phase control amount is 90 degrees, the output voltages of the voltage-variable power supplies 16 are set by the control signal supplied from the control unit (not shown) so that the impedance between the source and the drain of the transistor 17 is minimized. Further, the amplification factor of the gain-variable amplifier 19-1 is set to the highest level.

Next, a case where the phase control amount is neither 0 degrees nor 90 degrees is explained. In this case, the output voltages of the voltage-variable power supplies 16 are set by the control signal supplied from the control unit (not shown) so that the impedance between the source and the drain of the transistor 17 gets closer to the characteristic impedance of the transmission line or to the impedance of the system. The amplification factors of the gain-variable amplifiers 19-1 and 19-2 are set to an appropriate amplification factor according to the phase control amount.

FIG. 4 is a table showing relations between phase control amounts, impedances of the transistors 17-1 and 17-2, and the gain-variable amplifiers 19-1 to 19-4. When the impedance between the source and the drain of the transistor 17 is set to the maximum value in the phase shifter shown in FIG. 3, it is expressed as "maximum", whereas it is set to the minimum value, it is expressed as "minimum". Further, when the amplification factor of the gain-variable amplifier 19 is set to the lowest level in the phase shifter shown in FIG. 3, it is expressed as "OFF", whereas all the other cases are expressed as "ON".

Figure 5:
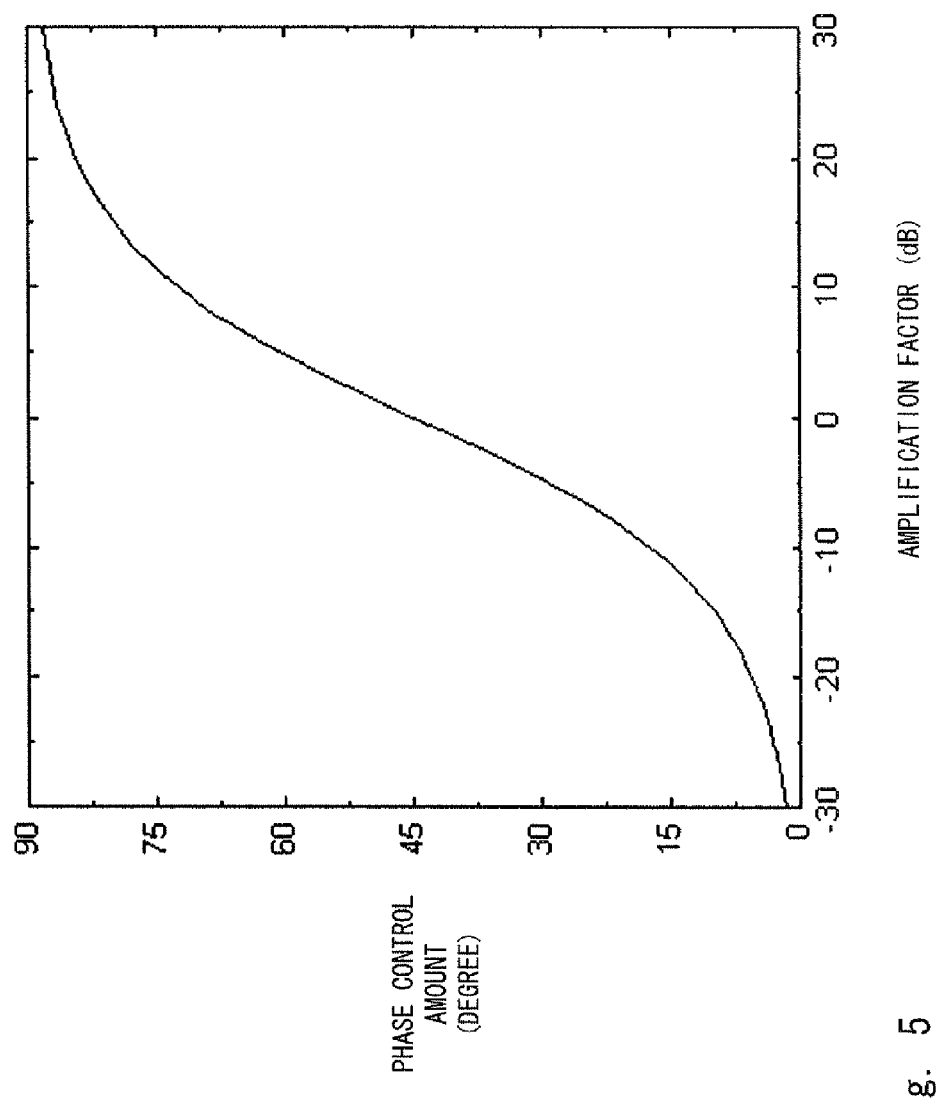
FIG. 5 is a graph showing a relation between the ratio between the gain-variable amplifier amplification factors and phase control amounts according to a first exemplary embodiment.
Figure 6:
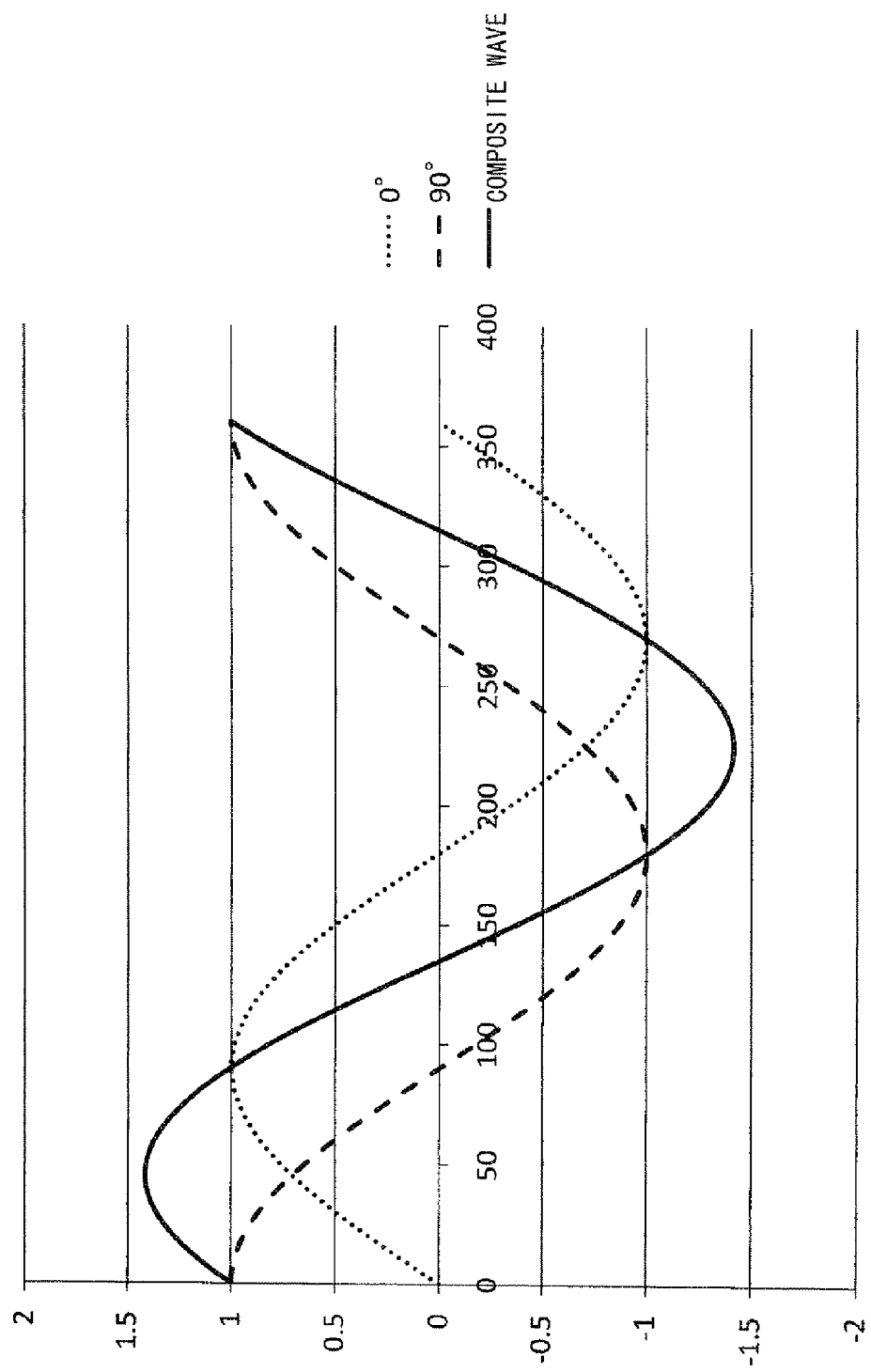
FIG. 6 is a conceptual graph showing that a phase control amount can be changed by combining signals having different amplification factors in a phase shifter according to a first exemplary embodiment.
Figure 7:
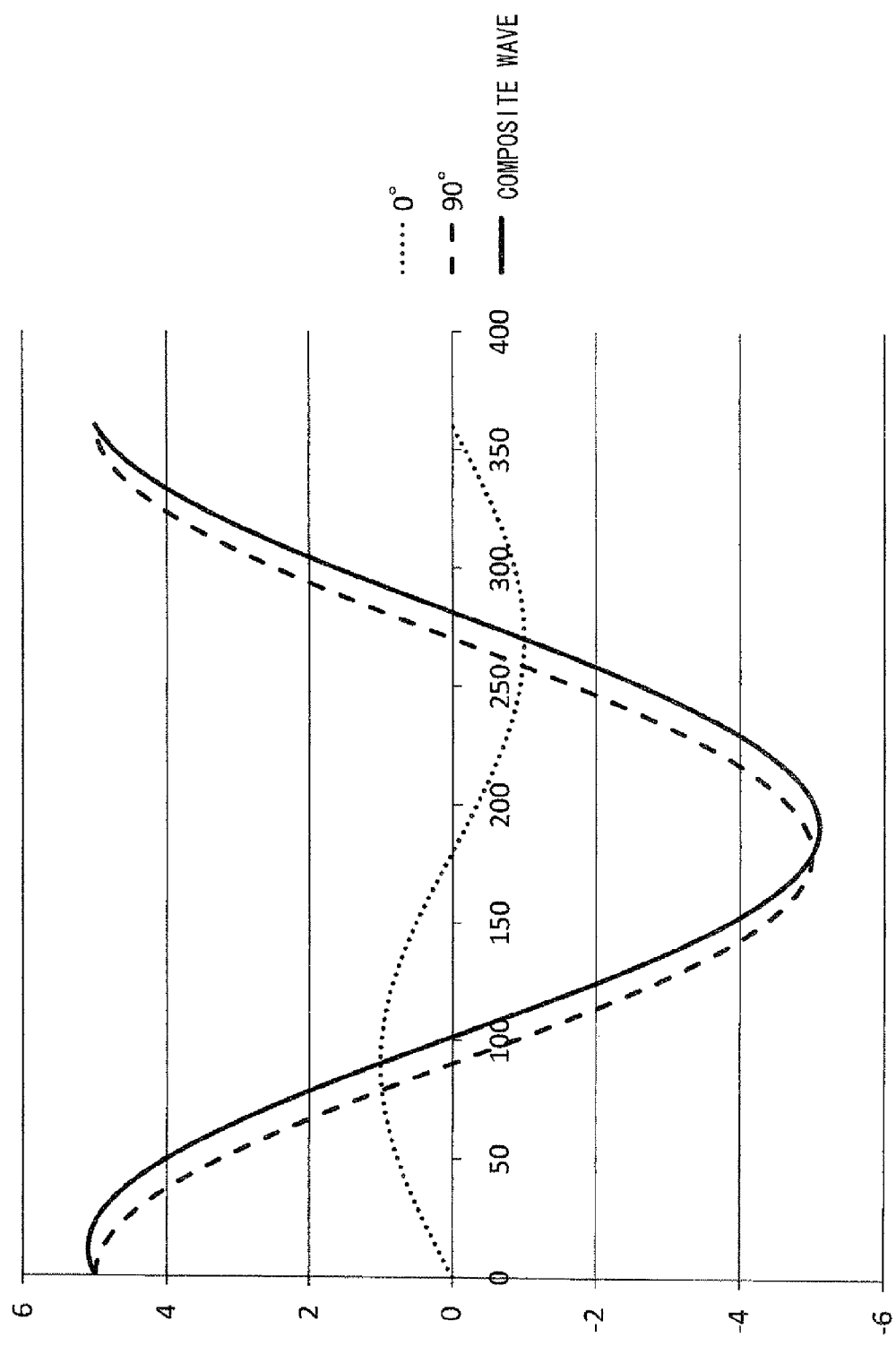
FIG. 7 is a conceptual graph showing that a phase control amount can be changed by combining signals having different amplification factors in a phase shifter according to a first exemplary embodiment.

FIG. 5 is a graph showing a relation between the ratio between the amplification factors of the gain-variable amplifier 19-1 and 19-2 and phase control amounts of the 0-to-90-degree phase shifter 13. As shown in the graph, it is possible to change the phase control amount of the 0-to-90-degree phase shifter 13 by changing the ratio between the amplification factors. Further, FIGS. 6 and 7 shows conceptual graphs relating to the control of the phase control amount performed by changing the ratio between the amplification factors of the gain-variable amplifiers 19-1 and 19-2 (the gain-variable amplifier 19-1 is the numerator). FIGS. 6 and 7 show that the phase control amount can be changed by combining signals having different amplification factors.

Next, advantageous effects of the phase shifter according to this exemplary embodiment are explained. As described above, when the phase control amount is controlled in steps of 90 degrees (0 degrees and 90 degrees), the 0-to-90-degree phase shifters 13 set the impedance between the source and the drain of the transistor 17 to the minimum value or the maximum value. When the phase control amount is controlled in steps of 90 degrees, the output signal is supplied only from one of the output ports of the 90-degree divider 18. Therefore, it is possible to reduce the transmission loss by appropriately setting the impedance between the source and the drain of the transistor 17.

Figure 8:
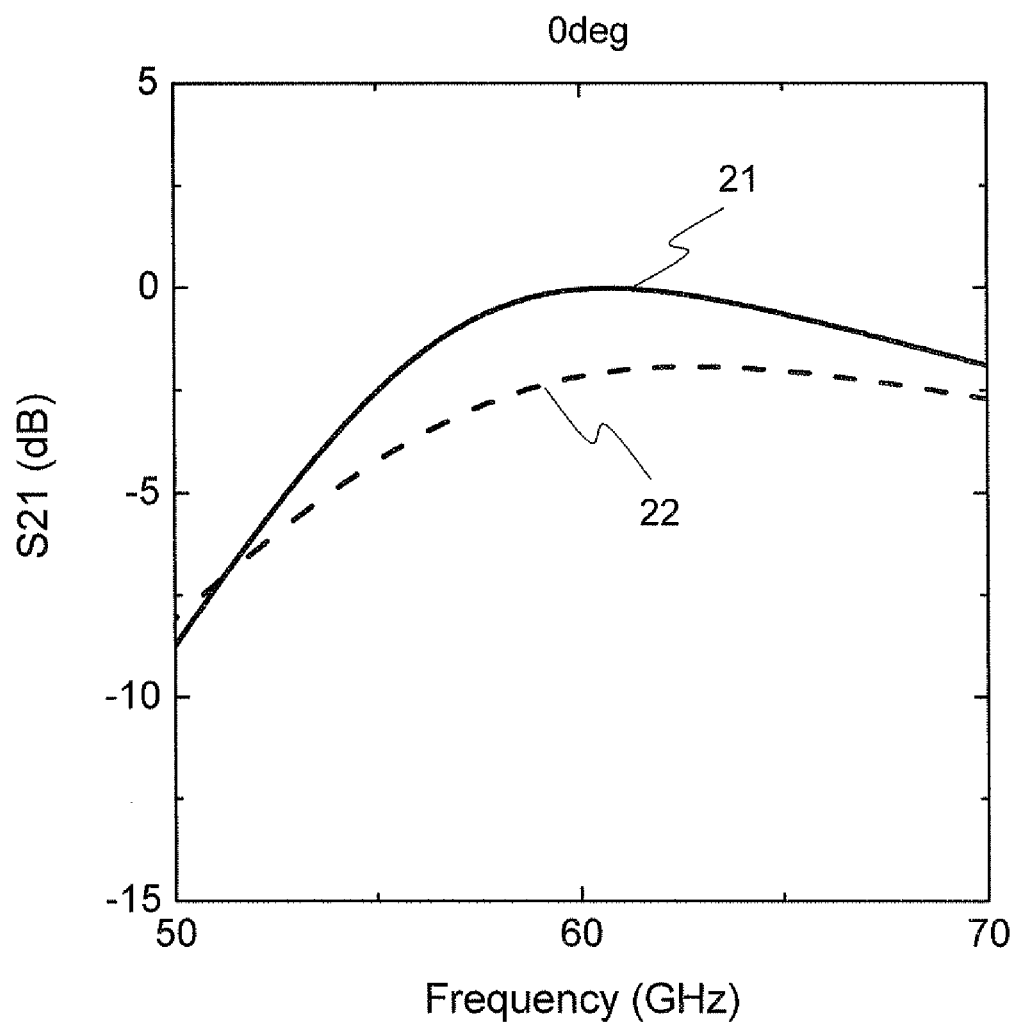
FIG. 8 is a graph showing insertion losses of a 0-to-90-degree phase shifter in a phase shifter according to a first exemplary embodiment when the phase control amount is 0 degrees.
Figure 16:
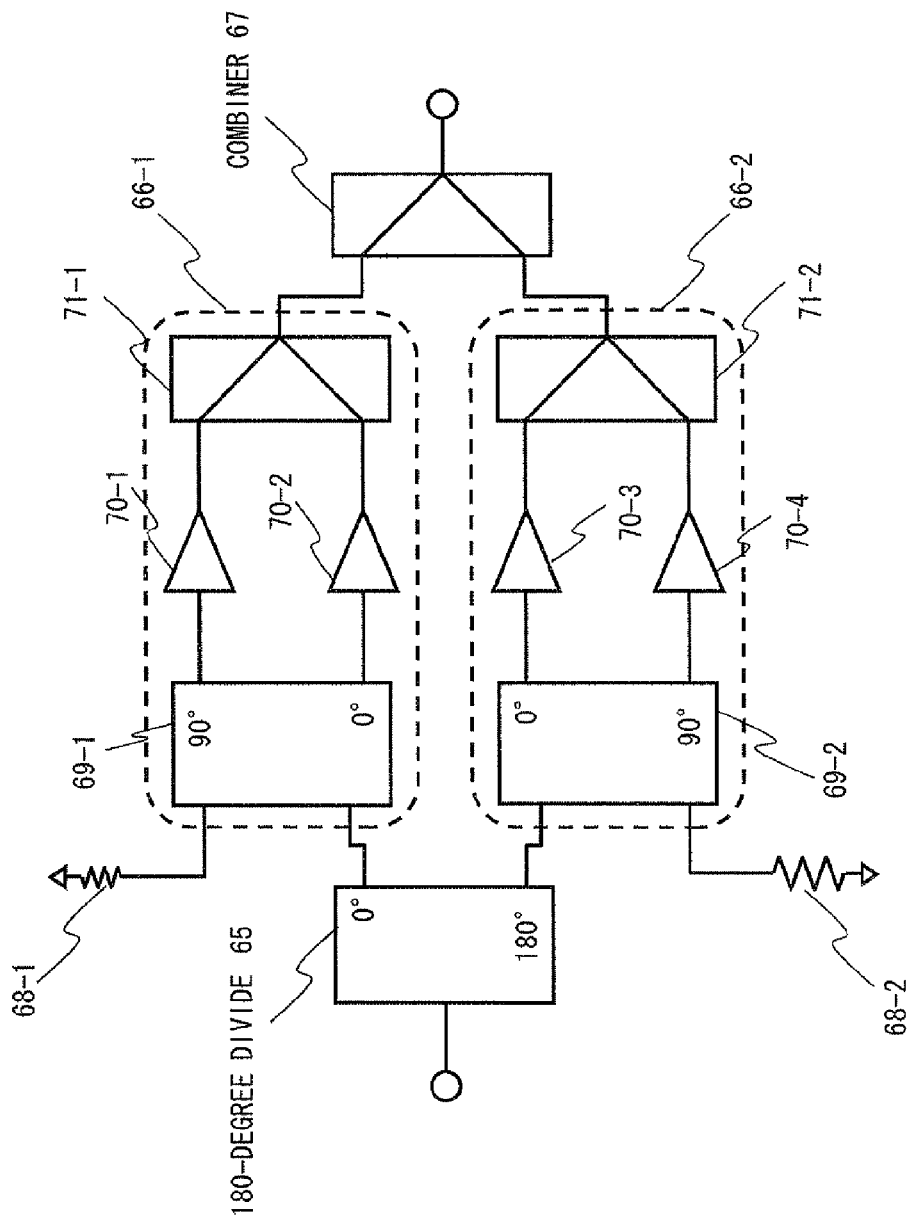
FIG. 16 is a block diagram showing a configuration of a typical phase shifter.

FIG. 8 is a graph showing calculation results of insertion losses of the 0-to-90-degree phase shifters 13 when the phase control amount of the 0-to-90-degree phase shifters 13 is 0 degrees. A solid line 21 indicates insertion losses of the phase shifter according to this exemplary embodiment. A dotted line 22 indicates insertion losses of the phase shifter shown in FIG. 16. As shown in FIG. 8, the electric power of the phase shifter according to this exemplary embodiment is higher than that of the phase shifter shown in FIG. 16. That is, according to the phase shifter in accordance with this exemplary embodiment, it is possible to reduce the insertion loss.

Figure 9:
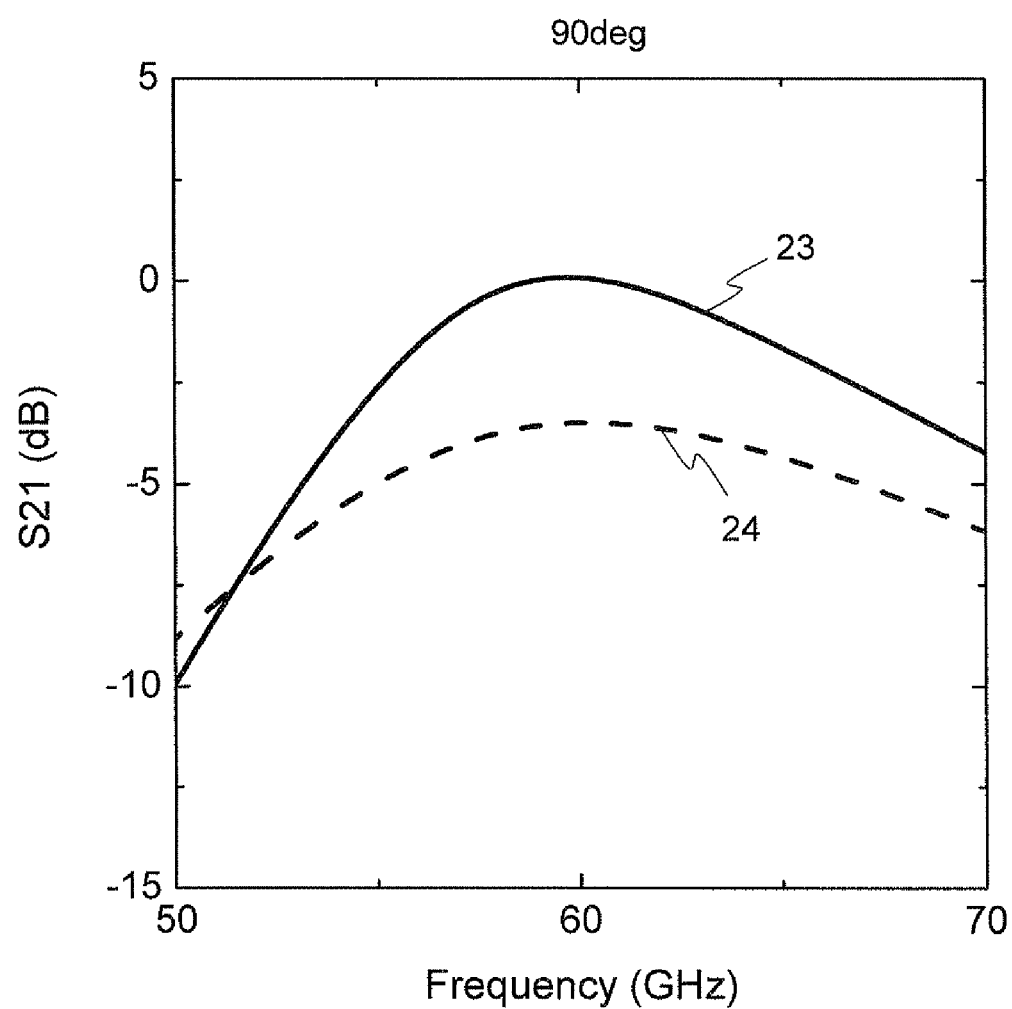
FIG. 9 is a graph showing insertion losses of a 0-to-90-degree phase shifter in a phase shifter according to a first exemplary embodiment when the phase control amount is 90 degrees.

FIG. 9 is a graph showing calculation results of insertion losses of the 0-to-90-degree phase shifters 13 when the phase control amount of the 0-to-90-degree phase shifters 13 is 90 degrees. A solid line 23 indicates insertion losses of the phase shifter according to this exemplary embodiment. A dotted line 24 indicates insertion losses of the phase shifter shown in FIG. 16. As shown in FIG. 9, the electric power of the phase shifter according to this exemplary embodiment is higher than that of the phase shifter shown in FIG. 16. That is, according to the phase shifter in accordance with this exemplary embodiment, it is possible to reduce the insertion loss.

Note that although the gain-variable amplifiers 19 are used in this exemplary embodiment, the present invention is not limited to this configuration. That is, any circuits capable of adjusting the amplitude of an input signal may be used.

<Second Exemplary Embodiment>

A phase shifter according to this exemplary embodiment is characterized in that the isolation ports of 0-to-90-degree phase shifters are in an opened state, is connected to the ground, or is connected to a resistor. The phase shifter according to this exemplary embodiment is different from the phase shifter according to the first exemplary embodiment (FIG. 3) only in the configuration of the 0-to-90-degree phase shifters. Therefore, the 0-to-90-degree phase shifter according to this exemplary embodiment is explained hereinafter.

Figure 10:
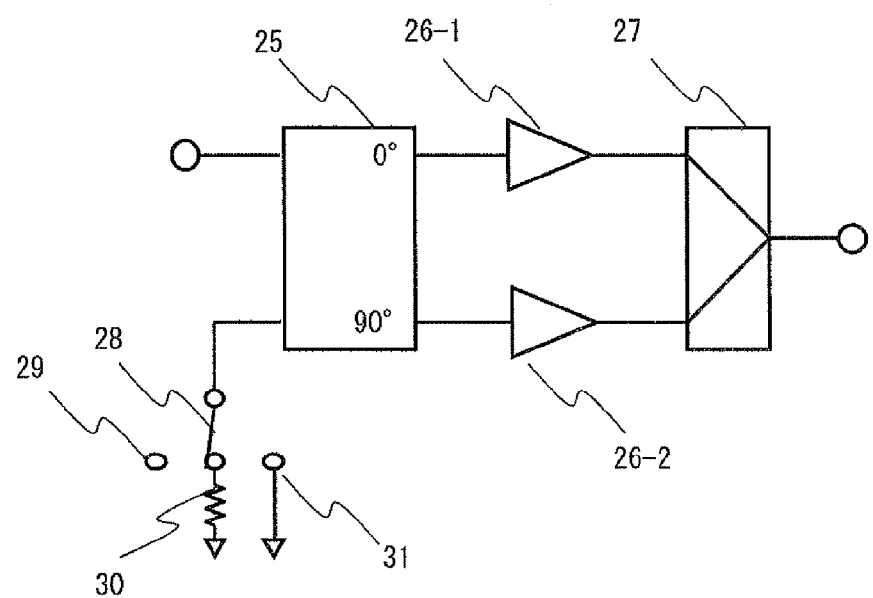
FIG. 10 is a block diagram showing a configuration of a 0-to-90-degree phase shifter according to a second exemplary embodiment.

FIG. 10 is a block diagram showing a configuration of a 0-to-90-degree phase shifter according to this exemplary embodiment. This 0-to-90-degree phase shifter includes a 90-degree divider 25, gain-variable amplifiers 26, a combiner 27, a switch 28, an opened port 29, a resistor port 30, and a ground port 31.

One end of the switch 28 is connected to the isolation port of the 90-degree divider 25. Further, the other end of the switch 28 is connected to one of the opened port 29, the resistor port 30, and the ground port 31 according to the phase control amount. The resistor that is connected to the resistor port 30 preferably has a resistance value equal to the characteristic impedance of the transmission line or the impedance of the system. Typically, a 50Ω-resistor is connected.

A signal input to the 0-to-90-degree phase shifter is divided into two signals having a 90° phase difference by the 90-degree divider 25, and these two signals are supplied to the two gain-variable amplifiers 26. The signals input to the gain-variable amplifiers 26 are changed in their amplitudes. The gain-variable amplifiers 26 supply the signals, whose amplitudes have been changed, to the combiner 27. The combiner 27 combines the input two signals. The combiner 27 externally outputs the combined signal from the 0-to-90-degree phase shifter.

Next, operations of the 0-to-90-degree phase shifter according to this exemplary embodiment for cases where the phase control amount of the 0-to-90-degree phase shifter is 0 degrees, 90 degrees, and 0 to 90 degrees (except for 0 and 90 degrees) are explained.

When the phase control amount is 0 degrees, the isolation port of the 90-degree divider 25 is connected to the opened port 29 through the switch 28 according to a control signal supplied from a control unit (not shown). Further, when the phase control amount is 0 degrees, the amplification factor of the gain-variable amplifier 26-2 is set to the lowest level.

When the phase control amount is 90 degrees, the isolation port of the 90-degree divider 25 is connected to the ground port 31 through the switch 28 according to the control signal supplied from the control unit (not shown). Further, when the phase control amount is 90 degrees, the amplification factor of the gain-variable amplifier 26-1 is set to the lowest level.

Next, a case where the phase control amount is neither 0 degrees nor 90 degrees is explained. In this case, the isolation port of the 90-degree divider 25 is connected to the resistor port 30 through the switch 28 according to the control signal supplied from the control unit (not shown). The amplification factors of the gain-variable amplifiers 26-1 and 26-2 are appropriately set according to the phase control amount.

According to the phase shifter in accordance with this exemplary embodiment, it is possible to appropriately control the resistance value connected to the isolation port of the 90-degree divider 25 according to the phase control amount. As a result, it is possible to reduce the transmission loss.

<Third Exemplary Embodiment>

A phase shifter according to this exemplary embodiment is characterized in that switches are provided between the 90-degree divider and the gain-variable amplifiers. The phase shifter according to this exemplary embodiment is different from the phase shifters according to the first and exemplary embodiments only in the configuration of the 0-to-90-degree phase shifters. Therefore, the 0-to-90-degree phase shifter according to this exemplary embodiment is explained hereinafter.

Figure 11:
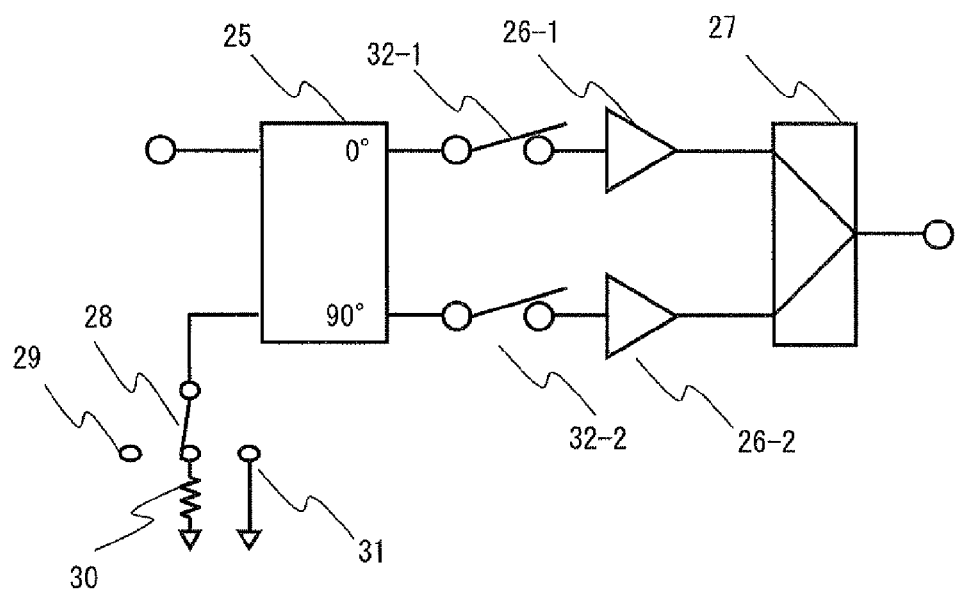
FIG. 11 is a block diagram showing a configuration of a 0-to-90-degree phase shifter according to a third exemplary embodiment.

FIG. 11 is a block diagram showing a configuration of a 0-to-90-degree phase shifter according to this exemplary embodiment. This 0-to-90-degree phase shifter includes a 90-degree divider 25, gain-variable amplifiers 26, a combiner 27, a switch 28, an opened port 29, a resistor port 30, a ground port 31, and switches 32.

The switch 32-1 is a switch that controls the connection between the 0-degree output port of the 90-degree divider 25 and the gain-variable amplifier 26-1. The switch 32-1 is opened when the phase control amount is 90 degrees. The switch 32-2 is a switch that controls the connection between the 90-degree output port of the 90-degree divider 25 and the gain-variable amplifier 26-2. The switch 32-2 is opened when the phase control amount is 0 degrees.

One end of the switch 28 is connected to the isolation port of the 90-degree divider 25. Further, the other end of the switch 28 is connected to one of the opened port 29, the resistor port 30, and the ground port 31 according to the phase control amount. The resistor that is connected to the resistor port 30 preferably has a resistance value equal to the characteristic impedance of the transmission line or the impedance of the system. Typically, a 50Ω-resistor is connected.

A signal input to the 0-to-90-degree phase shifter is divided into two signals having a 90-degree phase difference by the 90-degree divider 25, and these two signals are supplied to the two gain-variable amplifiers 26 through the switches 32. The signals input to the gain-variable amplifiers 26 are changed in their amplitudes. The gain-variable amplifiers 26 supply the signals, whose amplitudes have been changed, to the combiner 27. The combiner 27 combines the input two signals. The combiner 27 externally outputs the combined signal from the 0-to-90-degree phase shifter.

Next, operations of the 0-to-90-degree phase shifter according to this exemplary embodiment for cases where the phase control amount of the 0-to-90-degree phase shifter is 0 degrees, 90 degrees, and 0 to 90 degrees (except for 0 and 90 degrees) are explained.

When the phase control amount is 0 degrees, the isolation port of the 90-degree divider 25 is connected to the opened port 29 through the switch 28 according to a control signal supplied from a control unit (not shown). The switch 32-1 becomes a connected state. That is, the path between the 90-degree divider 25 and the gain-variable amplifier 26-1 is connected. Meanwhile, the switch 32-2 becomes an opened state. That is, the path between the 90-degree divider 25 and the gain-variable amplifier 26-2 is disconnected.

When the phase control amount is 90 degrees, the isolation port of the 90-degree divider 25 is connected to the ground port 31 through the switch 28 according to the control signal supplied from the control unit (not shown). The switch 32-2 becomes a connected state. That is, the path between the 90-degree divider 25 and the gain-variable amplifier 26-2 is connected. Meanwhile, the switch 32-1 becomes an opened state. That is, the path between the 90-degree divider 25 and the gain-variable amplifier 26-1 is disconnected.

Next, a case where the phase control amount is neither 0 degrees nor 90 degrees is explained. In this case, the isolation port of the 90-degree divider 25 is connected to the resistor port 30 through the switch 28 according to the control signal supplied from the control unit (not shown). Each of the switches 32-1 and 32-2 becomes a connected state. That is, the path between the 90-degree divider 25 and the gain-variable amplifier 26-1 is connected. Further, the path between the 90-degree divider 25 and the gain-variable amplifier 26-2 is also connected. The amplification factors of the gain-variable amplifiers 26-1 and 26-2 are appropriately set according to the phase control amount.

According to the phase shifter in accordance with this exemplary embodiment, it is possible to appropriately control the resistance value connected to the isolation port of the 90-degree divider 25 according to the phase control amount. As a result, it is possible to reduce the transmission loss. Further, since the connection between the 90-degree divider 25 and the gain-variable amplifiers 26 is controlled by the switches 32, the control for the case where the desired phase control amount is 0 degrees or 90 degrees is performed more reliably. That is, when the phase control amount is 0 degrees, the output port on the 90-degree side is completely cut off. Further, when the phase control amount is 90 degrees, the output port on the 0-degree side is completely cut off. In this way, it is possible to perform the phase control more correctly.

<Fourth Exemplary Embodiment>

A phase shifter according to this exemplary embodiment is characterized in that 0-to-90-degree phase shifters and a 0/180-degree phase shifter are connected in series.

Figure 12:
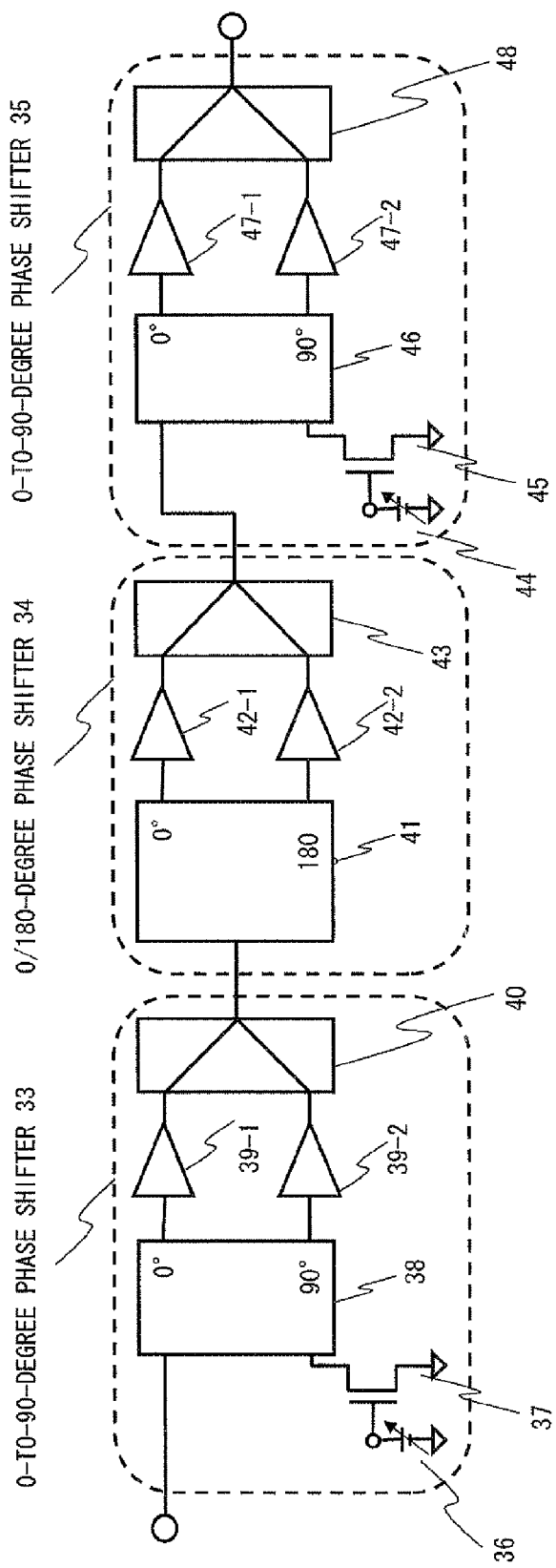
FIG. 12 is a block diagram showing a configuration of a phase shifter according to a fourth exemplary embodiment.

FIG. 12 is a block diagram showing a configuration of a phase shifter according to this exemplary embodiment. This phase shifter is a phase shifter that performs phase control ranging from 0 to 360 degrees. This phase shifter includes a 0-to-90-degree phase shifter 33, a 0/180-degree phase shifter 34, and another 0-to-90-degree phase shifter 35. The 0-to-90-degree phase shifter 33, the 0/180-degree phase shifter 34, the 0-to-90-degree phase shifter 35 are connected in series.

The 0-to-90-degree phase shifter 33 includes a voltage-variable power supply 36, a transistor 37, a 90-degree divider 38, gain-variable amplifiers 39, and a combiner 40. The 0-to-90-degree phase shifter 35 includes a voltage-variable power supply 44, a transistor 45, a 90-degree divider 46, gain-variable amplifiers 47, and a combiner 48. When the 0-to-90-degree phase shifter 33 performs phase control ranging from 0 to 90 degrees, the 0-to-90-degree phase shifter 35 performs only the phase control of 0 degrees or 90 degrees. Similarly, when the 0-to-90-degree phase shifter 35 performs phase control ranging from 0 to 90 degrees, the 0-to-90-degree phase shifter 33 performs only the phase control of 0 degrees or 90 degrees. Each of the 0-to-90-degree phase shifters 33 and 35 has a similar configuration to that of the 0-to-90-degree phase shifter shown in the first exemplary embodiment, and therefore their detailed explanation is omitted.

The 0/180-degree phase shifter 34 includes a 180-degree divider 41, gain-variable amplifiers 42, and a combiner 43. The 0/180-degree phase shifter 34 is a phase shifter that outputs a signal obtained by giving a phase of 0 degrees or 180 degrees to an input signal.

A signal is input from the 0-to-90-degree phase shifter 33 to the 180-degree divider 41 of the 0/180-degree phase shifter 34. This input signal is divided into two signals having a 180-degree phase difference by the 180-degree divider 41, and these two signals are supplied to the two gain-variable amplifiers 42 (42-1 and 42-2) respectively. Each of the gain-variable amplifiers 42 changes the amplitude of the input signal and supplies the signal, whose amplitude has been changed, to the combiner 43. The combiner 43 combines the signals input from the two gain-variable amplifiers 42 (42-1 and 42-2). The combiner 43 supplies the combined signal to the 0-to-90-degree phase shifter 35.

When the phase control amount in the 0/180-degree phase shifter 34 is 0 degrees, the amplification factor of the gain-variable amplifier 42-2, which is connected to the 180-degree port side of the 180-degree divider 41, is set to the lowest level. When the phase control amount in the 0/180-degree phase shifter 34 is 180 degrees, the amplification factor of the gain-variable amplifier 42-1, which is connected to the 0-degree port side of the 180-degree divider 41, is set to the lowest level.

According to the phase shifter in accordance with this exemplary embodiment, it is possible to appropriately control the resistance values connected to the isolation ports of the 90-degree dividers 38 and 46 according to the phase control amount. As a result, it is possible to reduce the transmission loss.

Note that in the phase shifter according to this exemplary embodiment, the connection order of the 0-to-90-degree phase shifter 33, the 0/180-degree phase shifter 34, and the 0-to-90-degree phase shifter 35 can be arbitrarily determined. Further, the 180-degree divider 41 is formed by, for example, a rat race circuit, a Marchand balun, or the like.

<Fifth Exemplary Embodiment>

A phase shifter according to this exemplary embodiment is characterized in that the phase shifter includes a 0/180-degree phase shifter and a 0-to-90-degree phase shifter, and performs phase control in steps of 90 degrees.

Figure 13:
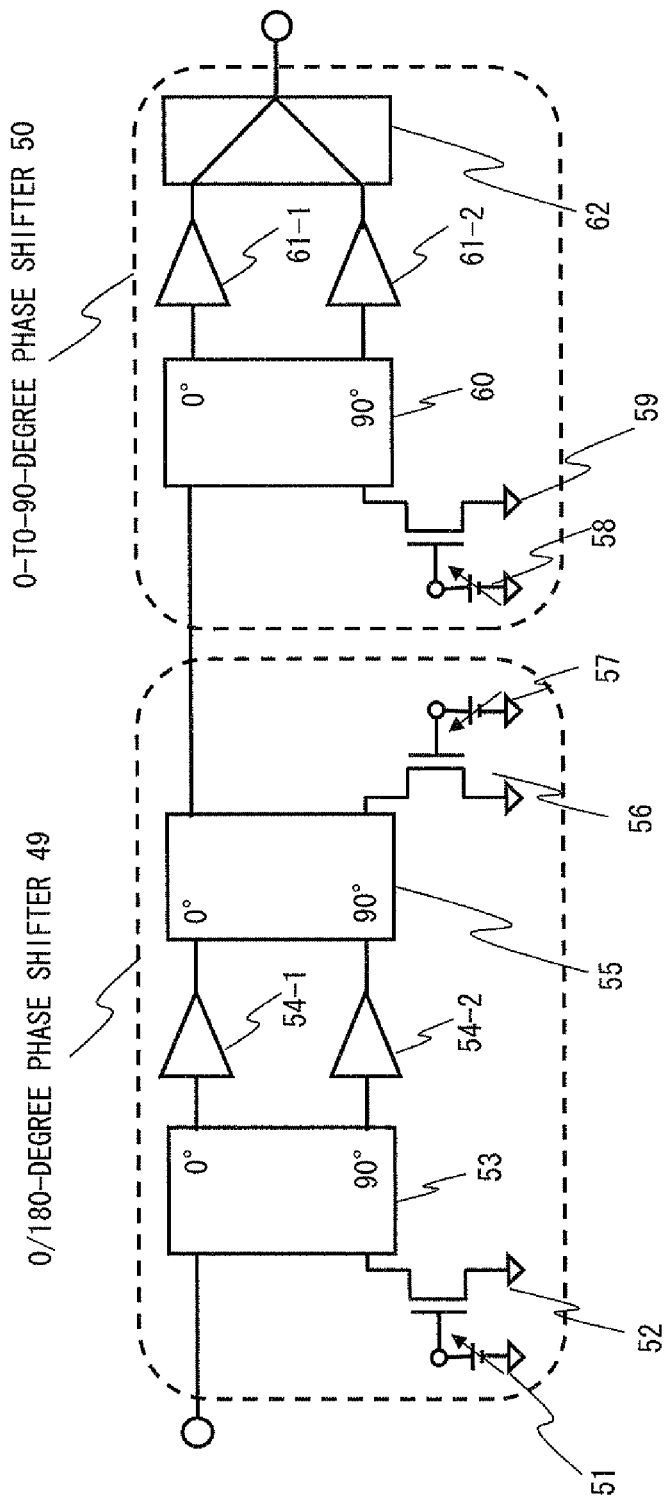
FIG. 13 is a block diagram showing a configuration of a phase shifter according to a fifth exemplary embodiment.

FIG. 13 is a block diagram showing a configuration of a phase shifter according to this exemplary embodiment. A phase shifter according to this exemplary embodiment includes a 0/180-degree phase shifter 49 and a 0-to-90-degree phase shifter 50. The 0/180-degree phase shifter 49 includes a voltage-variable power supply 51, a transistor 52, a 90-degree divider 53, gain-variable amplifiers 54, a 90-degree divider 55, a transistor 56, and a voltage-variable power supply 57. The transistor 52 is connected to the isolation port of the 90-degree divider 53. The transistor 56 is connected to the isolation port of the 90-degree divider 55.

A signal input to the 0/180-degree phase shifter 49 is divided into two signals having a 90-degree phase difference by the 90-degree divider 53, and these two signals are supplied to the gain-variable amplifiers 54 (54-1 and 54-2).

Each of the gain-variable amplifiers 54 (54-1 and 54-2) adjusts the amplitude of an input signal. The gain-variable amplifiers 54 supply the signals, whose amplitudes have been adjusted, to the 90-degree divider 55. The 90-degree divider 55 combines the two signals input from the gain-variable amplifiers 54 and thereby generates a combined signal to which a phase difference of 90 degrees is given. That is, the 90-degree divider 55 outputs the signal input from the gain-variable amplifier 54-1 without performing any phase shift, or outputs a signal that is obtained by further giving a phase of 90 degrees to the signal input from the gain-variable amplifier 54-2. The 0/180-degree phase shifter 49 performs phase control of 0 degrees or 180 degrees for an input signal.

When the phase control amount of the 0/180-degree phase shifter 49 is 0 degrees, the output voltage of the voltage-variable power supply 57 is set by a control signal supplied from a control unit (not shown) so that the impedance between the source and the drain of each of the transistors 52 and 56 is maximized. Further, the amplification factor of the gain-variable amplifier 54-2 is set to the lowest level.

When the phase control amount of the 0/180-degree phase shifter 49 is 180 degrees, the output voltage of the voltage-variable power supply 57 is set by the control signal supplied from the control unit (not shown) so that the impedance between the source and the drain of each of the transistors 52 and 56 is minimized. Further, the amplification factor of the gain-variable amplifier 54-1 is set to the lowest level.

The 0-to-90-degree phase shifter 50 includes a voltage-variable power supply 58, a transistor 59, a 90-degree divider 60, gain-variable amplifiers 61, and a combiner 62. The 0-to-90-degree phase shifter 50 performs phase control of 0 degrees or 90 degrees for an input signal. The 0-to-90-degree phase shifter 50 has a similar configuration to that of the 0-to-90-degree phase shifter shown in the first exemplary embodiment, and therefore their detailed explanation is omitted. As described above, the phase control amount of the 0/180-degree phase shifter 49 is 0 degrees or 180 degrees, and the phase control amount of the 0-to-90-degree phase shifter 50 is 0 degrees or 90 degrees. Therefore, the phase control amount of the phase shifter according to this exemplary embodiment is adjusted in steps of 90 degrees (0, 90, 180, and 270 degrees).

Although the phase shifter according to this exemplary embodiment can perform phase control only in steps of 90 degrees, its circuit configuration is simpler than those of the above-described first to fourth exemplary embodiments. Therefore, it is possible to reduce the circuit scale.

Note that the present invention not limited to the above-described exemplary embodiments, and they can be modified without departing from the spirit and scope of the present invention.

Figure 14:
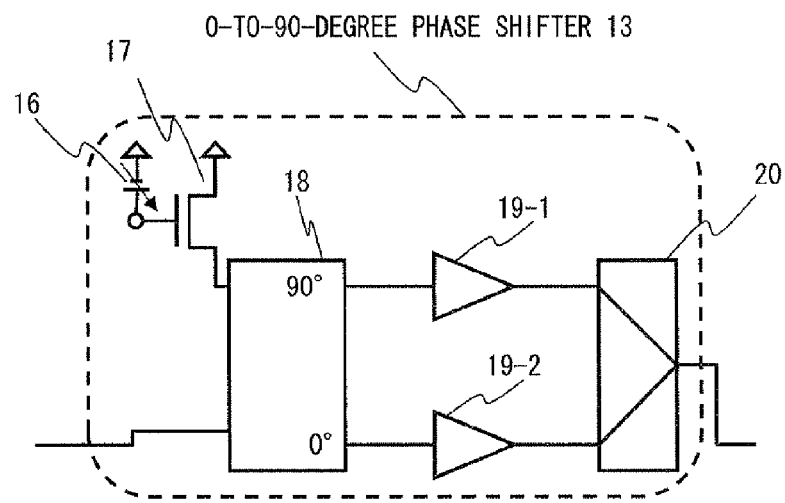
FIG. 14 is a block diagram showing a configuration of a 0-to-90-degree phase shifter according to a first exemplary embodiment.
Figure 15:
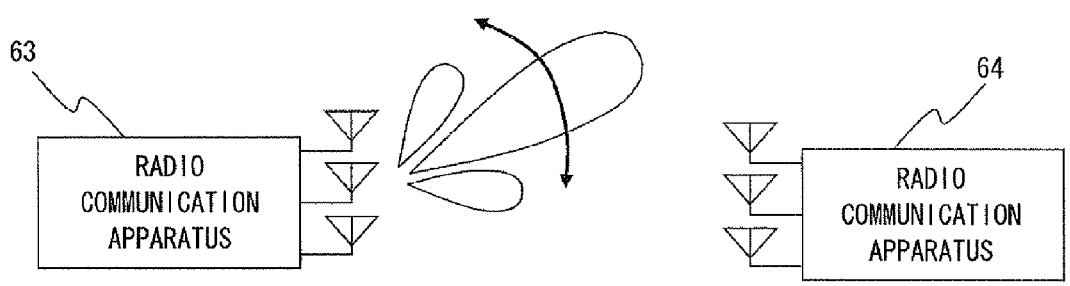
FIG. 15 is a conceptual diagram showing a configuration of a radio communication apparatus that automatically aligns an antenna.

Note that FIG. 14 shows the minimum configuration of a 0-to-90-degree phase shifter according to the first exemplary embodiment of the present invention. This 0-to-90-degree phase shifter 13 includes a voltage-variable power supply 16, a transistor 17, a 90-degree divider 18, gain-variable amplifiers 19, and a combiner 20.

The 90-degree divider 18 divides an input signal into a signal to which a 90-degree phase is given and a signal to which no phase is given, and outputs the divided signals to the gain-variable amplifiers 19. The gain-variable amplifiers 19 (19-1 and 19-2) output signals whose amplitudes have been changed according to a phase control amount to the combiner 20. The combiner 20 combines the signals input from the two gain-variable amplifiers 19 and outputs the combined signal. Note that the impedance between the source and the drain of the transistor connected to the isolation port of the 90-degree divider 18 can be changed as appropriate. That is, it is possible to appropriately control the resistance value connected to the isolation port. Therefore, it is possible to reduce the transmission loss.

The whole or part of the embodiments disclosed above can be described as, but not limited to, the following supplementary notes.

(Supplementary Note 1)
A phase shifter that gives a phase to an input signal in a range from 0 degrees to 90 degrees, including:
a 90-degree divider that divides an input signal into a signal to which a 90-degree phase is given and a signal to which no phase is given, and outputs the divided signals;
a first gain-variable amplifier that outputs a signal whose amplitude is changed according to a phase control amount of the phase shifter, the first gain-variable amplifier being connected to a 0-degree side output port of the 90-degree divider;
a second gain-variable amplifier that outputs a signal whose amplitude is changed according to the phase control amount, the second gain-variable amplifier being connected to a 90-degree side output port of the 90-degree divider; and
a combiner that combines an output signal of the first gain-variable amplifier and an output signal of the second gain-variable amplifier, in which
an impedance of an isolation port of the 90-degree divider is variable.

(Supplementary Note 2)
The phase shifter described in Supplementary note 1, in which the 90-degree divider is connected to a transistor through the isolation port, and an impedance between a source and a drain of the transistor can be changed according to the phase control amount.

(Supplementary Note 3)
The phase shifter described in Supplementary note 2, in which the impedance between the source and the drain of the transistor is set to a maximum value when the phase control amount is 0 degrees, and set to a minimum value when the phase control amount is 90 degrees.

(Supplementary Note 4)
The phase shifter described in Supplementary note 3, in which the impedance between the source and the drain of the transistor is set to a characteristic impedance of a transmission line when the phase control amount is greater than 0 degrees and smaller than 90 degrees.

(Supplementary Note 5)
The phase shifter described in Supplementary note 1, in which
the 90-degree divider is connected to a first switch through the isolation port, and
the first switch is brought into an opened state, is connected to a ground, or is connected to a resistor according to the phase control amount.

(Supplementary Note 6)
The phase shifter described in Supplementary note 5, in which the first switch is brought into the opened state when the phase control amount is 0 degrees, and is connected to the ground when the phase control amount is 90 degrees.

(Supplementary Note 7)
The phase shifter described in Supplementary note 6, in which the first switch is connected to the resistor when the phase control amount is greater than 0 degrees and smaller than 90 degrees.

(Supplementary Note 8)
The phase shifter described in any one of Supplementary notes 1 to 7, in which
an amplification factor of the second gain-variable amplifier is set to a minimum value when the phase control amount is 0 degrees, and
an amplification factor of the first gain-variable amplifier is set to a minimum value when the phase control amount is 90 degrees.

(Supplementary Note 9)

The phase shifter described in any one of Supplementary notes 1 to 8, in which amplification factors of the first and second gain-variable amplifiers are set according to the phase control amount when the phase control amount is greater than 0 degrees and smaller than 90 degrees.

(Supplementary Note 10)

The phase shifter described in any one of Supplementary notes 1 to 9, further including:

a second switch disposed between the first gain-variable amplifier and the 90-degree divider; and a third switch disposed between the second gain-variable amplifier and the 90-degree divider, in which the second switch becomes an opened state when the phase control amount is 90 degrees, and the third switch becomes an opened state when the phase control amount is 0 degrees.

(Supplementary Note 11)

A 0-to-360-degree phase shifter that gives a phase to an input signal in a range from 0 degrees to 360 degrees, including:

a 180-degree divider that divides the input signal into a signal to which a 180-degree phase is given and a signal to which no phase is given, and outputs the divided signals;

two 0-to-90-degree phase shifters each of which gives a phase in a range from 0 degrees to 90 degrees, outputs of the 180-degree divider being respectively input to the two 0-to-90-degree phase shifters; and a combiner that combines outputs of the two 0-to-90-degree phase shifters, in which each of the two 0-to-90-degree phase shifters is a phase shifter described in any one of Supplementary notes 1 to 10.

(Supplementary Note 12)

A 0-to-360-degree phase shifter that gives a phase to an input signal in a range from 0 degrees to 360 degrees, including:

a 0/180-degree phase shifter that gives a phase of 0 degrees or 180 degrees to an input signal; and two 0-to-90-degree phase shifters connected in series with the 0/180-degree phase shifter, in which each of the two 0-to-90-degree phase shifters is a phase shifter described in any one of Supplementary notes 1 to 10.

(Supplementary Note 13)

A 90-degree-step phase shifter that gives a phase of 0, 90, 180 or 270 degrees to an input signal, in which a phase shifter described in any one of Supplementary notes 1 to 10 and a 0/180-degree phase shifter that gives a phase of 0 degrees or 180 degrees to an input signal are connected in series.

(Supplementary Note 14)

The 90-degree-step phase shifter described in Supplementary note 13, in which the 0/180-degree phase shifter includes:

a 90-degree divider that divides an input signal into a signal to which a 90-degree phase is given and a signal to which no phase is given, and outputs the divided signals; and a 90-degree divide that combines two signals each of which is obtained by making a respective one of the signals output from the 90-degree divider have an amplitude according to a desired phase delay amount, and each of these two 90-degree dividers includes a 4-terminal circuit, and an impedance of an isolation port is variable.

(Supplementary Note 15)

The 90-degree-step phase shifter described in Supplementary note 14, in which in the 0/180-degree phase shifter, the 90-degree divider is connected to a transistor through the isolation port, and an impedance between a source and a drain of the transistor can be changed according to the phase control amount.

(Supplementary Note 16)

The 90-degree-step phase shifter described in Supplementary note 15, in which in the 0/180-degree phase shifter, the impedance between the source and the drain of the transistor is set to a maximum value when a phase control amount of a phase shifter is 0 degrees or 90 degrees, and is set to a minimum value when the phase control amount of the phase shifter is 180 degrees or 270 degrees.

(Supplementary Note 17)

The 0-to-360-degree phase shifter described in Supplementary note 11 or 12, in which the phase control amount can be set based on a control signal.

(Supplementary Note 18)

A radio communication apparatus including a phase shifter described in any one of Supplementary notes 1 to 10 and an antenna array.

(Supplementary Note 19)

A radio receiving apparatus including a phase shifter described in any one of Supplementary notes 1 to 10 and an antenna array.

(Supplementary Note 20)

A radio transmitting apparatus including a phase shifter described in any one of Supplementary notes 1 to 10 and an antenna array.

This application is based upon and claims the benefit of priority from Japanese patent application No. 2010-096013, filed on Apr. 19, 2010, the disclosure of which is incorporated herein in its entirety by reference.

Industrial Applicability

The present invention can be applied to, for example, phase shifters used in radio communication apparatuses that handle radio signals.

REFERENCE SIGNS LIST

1 TRANSMISSION BASEBAND SIGNAL GENERATION UNIT
2 TRANSMITTER
3-1 to 3-h TRANSMISSION ANTENNA
4 CONTROL UNIT
5 LOCAL SIGNAL OSCILLATOR CIRCUIT
6 RECEPTION BASEBAND SIGNAL PROCESSING UNIT
7 RECEIVER
8-1 to 8-k RECEPTION ANTENNA
9 LOCAL SIGNAL AMPLIFIER
10 QUADRATURE MODULATOR
11-1 to 11-h PHASE SHIFTER
12-1 to 12-h TRANSMISSION ANTENNA
13, 33, 35, 50 0-TO-90-DEGREE PHASE SHIFTER
14, 41 180-DEGREE DIVIDER
15, 20, 27, 40, 43, 48, 62 COMBINER
16, 36, 44, 51, 57, 58 VOLTAGE-VARIABLE POWER SUPPLY
17, 37, 45, 52, 56, 59 TRANSISTOR
18, 25, 38, 46, 53, 55, 60 90-DEGREE DIVIDER
19, 26, 39, 42, 47, 54, 61 GAIN-VARIABLE AMPLIFIER
28, 32 SWITCH
29 OPENED PORT
30 RESISTOR PORT
31 GROUND PORT
34, 49 0/180-DEGREE PHASE SHIFTER
63, 64 RADIO COMMUNICATION APPARATUS

What is claimed is:

1. A phase shifter that gives a phase to an input signal in a range from 0 degrees to 90 degrees, comprising:
a 90-degree divider that divides an input signal into a signal to which a 90-degree phase is given and a signal to which no phase is given, and outputs the divided signals;
a first gain-variable amplifier that outputs a signal whose amplitude is changed according to a phase control amount of the phase shifter, the first gain-variable amplifier being connected to a 0-degree side output port of the 90-degree divider;
a second gain-variable amplifier that outputs a signal whose amplitude is changed according to the phase control amount, the second gain-variable amplifier being connected to a 90-degree side output port of the 90-degree divider; and
a combiner that combines an output signal of the first gain-variable amplifier and an output signal of the second gain-variable amplifier, wherein
an impedance of an isolation port of the 90-degree divider is variable, and
the 90-degree divider is connected to a transistor through the isolation port, and an impedance between a source and a drain of the transistor can be changed according to the phase control amount.

2. The phase shifter according to claim 1, wherein the impedance between the source and the drain of the transistor is set to a maximum value when the phase control amount is 0 degrees, and set to a minimum value when the phase control amount is 90 degrees.

3. The phase shifter according to claim 2, wherein the impedance between the source and the drain of the transistor is set to a characteristic impedance of a transmission line when the phase control amount is greater than 0 degrees and smaller than 90 degrees.

4. The phase shifter according to claim 1, wherein
the 90-degree divider is connected to a first switch through the isolation port, and
the first switch is brought into an opened state, is connected to a ground, or is connected to a resistor according to the phase control amount.

5. The phase shifter according to claim 1, further comprising:
a second switch disposed between the first gain-variable amplifier and the 90-degree divider; and
a third switch disposed between the second gain-variable amplifier and the 90-degree divider, wherein
the second switch becomes an opened state when the phase control amount is 90 degrees, and
the third switch becomes an opened state when the phase control amount is 0 degrees.

6. A 0-to-360-degree phase shifter that gives a phase to an input signal in a range from 0 degrees to 360 degrees, comprising:
a 180-degree divider that divides the input signal into a signal to which a 180-degree phase is given and a signal to which no phase is given, and outputs the divided signals;
two 0-to-90-degree phase shifters each of which gives a phase in a range from 0 degrees to 90 degrees, outputs of the 180-degree divider being respectively input to the two 0-to-90-degree phase shifters; and
a combiner that combines outputs of the two 0-to-90-degree phase shifters, wherein
each of the two 0-to-90-degree phase shifters is a phase shifter according to claim 1.

7. A 0-to-360-degree phase shifter that gives a phase to an input signal in a range from 0 degrees to 360 degrees, comprising:
a 0/180-degree phase shifter that gives a phase of 0 degrees or 180 degrees to an input signal; and
two 0-to-90-degree phase shifters connected in series with the 0/180-degree phase shifter, wherein
each of the two 0-to-90-degree phase shifters is a phase shifter according to claim 1.

8. A 90-degree-step phase shifter that gives a phase of 0, 90, 180 or 270 degrees to an input signal, wherein
a phase shifter according to claim 1 and a 0/180-degree phase shifter that gives a phase of 0 degrees or 180 degrees to an input signal are connected in series.

9. A radio communication apparatus comprising a phase shifter according to claim 1 and an antenna array.

* * * * *